United States Patent [19]

Akutsu et al.

[11] 4,337,486
[45] Jun. 29, 1982

[54] SYNCHRONIZING SIGNAL DISCRIMINATOR FOR USE IN CHANNEL SELECTION APPARATUS OF TELEVISION RECEIVER

[75] Inventors: Eisaku Akutsu; Shigeo Matsuura, both of Yokohama, Japan

[73] Assignee: Hitachi, Ltd., Tokyo, Japan

[21] Appl. No.: 212,256

[22] Filed: Dec. 2, 1980

[30] Foreign Application Priority Data

Dec. 3, 1979 [JP] Japan ................................ 54-155625

[51] Int. Cl.³ .......................................... H04N 5/08
[52] U.S. Cl. .................................. 358/155; 358/191.1
[58] Field of Search .................... 358/153, 155, 191.1, 358/193.1

[56] References Cited

U.S. PATENT DOCUMENTS 3,814,855  6/1974  Kokado ............................. 358/155
4,250,525  2/1981  Steckler et al. ..................... 358/155

Primary Examiner—Richard Murray
Attorney, Agent, or Firm—Craig and Antonelli

[57] ABSTRACT

A synchronizing signal discrimination circuit for use in a channel selection apparatus having a preset function of a television receiver is disclosed. The circuit has a function to discriminate a periodic and continuous signal and a non-periodic and one-shot signal to distinguish a synchronizing signal from a noise. The present synchronizing signal discrimination circuit determines a time period from the application of a first input signal to the input terminal to the application of a second input signal to the input terminal by the first time interval signal and the second time interval signal to detect only the periodic and continuous signal as the synchronizing signal.

8 Claims, 8 Drawing Figures

SYNCHRONIZING SIGNAL DISCRIMINATOR FOR USE IN CHANNEL SELECTION APPARATUS OF TELEVISION RECEIVER

The present invention relates to a channel selection apparatus of a television receiver, and more particularly to a synchronizing signal discriminator used to prevent a malfunction of an automatic preset device of a channel selection apparatus.

As a channel selection apparatus for a television receiver having an electronic tuner, a voltage synthesizer channel selection system has been known. In the channel selection apparatus of this type, a digital signal stored in a memory circuit is converted to an analog signal by a digital-analog conversion circuit and the analog signal is then fed to an electronic tuner to select a desired channel of television signal.

A block diagram of a conventional voltage synthesizer channel selection system is shown in FIG. 1. The channel selection system shown comprises an electronic tuner 1 connected to an antenna 7, a video IF amplification and detection circuit 2 connected to the electronic tuner 1, an AFC (automatic frequency control) voltage detection circuit 3 connected to the video IF amplification and detection circuit 2, a synchronizing signal discrimination circuit 4 connected to the video IF amplification and detection circuit 2, a preset control circuit 5 connected to the AFC voltage detection circuit 3 and the synchronizing signal discrimination circuit 4, a D/A conversion circuit 6 connected to the preset control circuit 5, a memory circuit 7 connected to the preset control circuit 5, a preset switch 10, a band selection circuit 11, and a channel selection switch 9 connected to the memory circuit 8. The electronic tuner 1 converts a high frequency signal received by the antenna 7 to a video IF signal, which is fed to the video IF amplification and detection circuit 2, which amplifies and detects the video IF signal. The AFC voltage detection circuit 3 detects an AFC voltage generated by the video IF amplification and detection circuit 2. When the AFC voltage reaches a predetermined level while the electronic tuner 1 receives the high frequency signal, the AFC voltage detection circuit 3 produces an output signal, which is fed to the preset control circuit 5. The synchronizing signal discrimination circuit 4 detects a synchronizing signal generated by the video IF amplification and detection circuit 2. When the synchronizing signal is fed from the video IF amplification and detection circuit 2, the synchronizing signal discrimination circuit produces an output signal, which is fed to the preset control circuit 5. In this channel selection system, a channel receiving a desired television signal is selected in the following manner. When a desired channel number is keyed by a keyboard switch (not shown) of the channel selection switch 9, a signal representative of that channel number is fed from the channel selection switch 9 to the memory circuit 8. When the memory circuit 8 receives the signal representative of the channel number, a digital signal stored in a memory unit corresponding to that signal is read out and the digital signal is fed through the preset control circuit 5 to the D/A conversion circuit 6. In the D/A conversion circuit 6, the digital signal received is converted to an analog signal, which is fed to the electronic tuner 1. In the electronic tuner 1, the analog signal is applied, for example, to a variable capacitance diode to change a tuning frequency of a tuning circuit so that the television signal corresponding to the channel number keyed in by the channel selection switch 9 is received. In this manner, the channel selection is completed. When the electronic tuner 1 receives the television signal, the high frequency television signal is converted to an IF signal, which is fed to the video IF amplification and detection circuit 2 where it is amplified and detected, and a video signal output is produced from a terminal 2A. When the electronic tuner 1 receives television signals of two or more frequency bands, the preset control circuit 5 sends a signal to the band selection circuit 11 to select a frequency band to be received by the electronic tuner 1 by an output signal from the band selection circuit 11 so that the electronic tuner 1 receives the television signals of the frequency band containing the desired channel.

In this channel selection system, the digital signal stored in the memory circuit 8 must be the one which causes the electronic tuner 1 to correctly receive the television signal. However, the performance of the electronic tuner differs from tuner to tuner and an optimum tuning voltage differs from tuner to tuner. Means for storing a correct digital signal in the memory circuit 8, that is, channel preset means is now explained.

As the preset switch 10 is actuated, it provides an output signal to the preset control circuit 5. When the preset control circuit 5 receives the signal from the preset switch 10, it generates a continuously varying digital signal, which is fed to the D/A conversion circuit 6, which in turn converts the digital signal to an analog signal. Since the digital value of the digital signal fed from the preset control circuit 5 continuously changes, the magnitude of the analog signal generated by the D/A conversion circuit 6 also continuously changes. For example, the analog signal generated by the D/A conversion circuit 6 may be a sweep voltage which gradually changes from a lower voltage to a higher voltage. This sweep voltage is fed from the D/A conversion circuit 6 to the electronic tuner 1. As the electronic tuner 1 receives the sweep voltage, the tuning frequency of the tuning circuit (not shown) of the electronic tuner 1 gradually changes. When the tuning frequency reaches the frequency of the television signal received by the antenna 7, the television signal is converted to the IF signal, which is fed to the video IF amplification and detection circuit 2. As the television signal is received by the electronic tuner 1 and fed to the video IF amplification and detection circuit 2, the AFC voltage generated by the video IF amplification and detection circuit 2 changes. The video IF amplification and detection circuit 2 also generates the synchronizing signal. The AFC voltage and the synchronizing signal generated by the video IF amplification and detection circuit 2 are fed to the AFC voltage detection circuit 3 and the synchronizing signal discrimination circuit 4, respectively. When the AFC voltage changes and reaches a predetermined voltage, the AFC voltage detection circuit 3 produces an output signal, which is fed to the preset control circuit 5. The AFC voltage detection circuit 3 functions to detect a condition in which the tuning circuit of the electronic tuner 1 is tuned to the optimum tuning frequency. When the synchronizing signal is fed from the video IF amplification and detection circuit 2 to the synchronizing signal discrimination circuit 4, the latter circuit 4 generates an output signal, which is fed to the preset control circuit 5. The synchronizing signal discrimination circuit 4 serves to verify that the signal received by the electronic tuner 1 is a correct television signal. That is, when the synchronizing signal discrimination circuit 4 receives the synchronizing signal from the video IF amplification and detection circuit 2, it determines that the electronic tuner 1 has received the television signal and produces the output signal, which is fed to the preset control circuit 5. When the preset control circuit 5 receives the output signals from the AFC voltage detection circuit 3 and the synchronizing signal discrimination circuit 4, it stops changing the digital value of the digital signal to be fed to the D/A conversion circuit 6. That is, the digital value of the digital signal is kept constant. As a result, the sweep voltage to be fed to the electronic tuner 1 from the D/A conversion circuit 6 is also kept constant. Consequently, the electronic tuner 1 continuously receives the television signal. The digital signal generated by the preset control circuit 5 is fed to the memory circuit 8 and it is stored in a first memory unit of the memory circuit 8. After the digital signal has been stored in the memory circuit 8, the preset control circuit 5 resumes to change the digital value of the digital signal. As a result, the output signal of D/A conversion circuit gradually changes again. The digital value of the digital signal continues to change until the electronic tuner 1 receives a television signal of another channel, when the electronic tuner 1 again receives the television signal and feeds the IF signal to the video IF amplification and detection circuit 2, the AFC voltage and the synchronizing signal generated by the video IF amplification and detection circuit 2 are detected by the AFC voltage detection circuit 3 and the synchronizing signal discrimination circuit 4, respectively. In the same manner as described above, the preset control circuit 5 again keeps the digital value of the digital signal constant, and the digital signal is stored in a second memory unit of the memory circuit 8. In this manner, the digital signals necessary to receive the television signals are sequentially stored in the memory circuit 8. After the channel preset for one receiving band, e.g. a VHF band, has been completed, the receiving band is switched by the band selection switch 11 so that the channel preset for other bands, e.g. a UHF band, is carried out. After the channel preset has been completed, the channel selection switch 9 is actuated to select a channel, as described above.

When the television signal received by the antenna 7 is weak, noises are superimposed on the AFC voltage or on the synchronizing signal generated by the video IF amplification and detection circuit 2. As a result, the AFC voltage detection circuit 3 and the synchronizing signal discrimination circuit 4 often malfunction. On the other hand, when the television signal received by the antenna 7 is very strong, the electronic tuner 1 generates a spurious wave which causes the AFC voltage to change and the synchronizing signal to generate. As a result, the AFC voltage detection circuit 3 and the synchronizing signal discrimination circuit 4 again malfunction. In the prior art synchronizing signal discrimination circuit 4, a flyback pulse generated in a horizontal deflection circuit of the television receiver and the synchronizing signal are applied to an AND gate to determine the presence or absence of the synchronizing signal. Therefore, the noise can easily pass through the AND gate so that the synchronizing signal discrimination circuit 4 malfunctions.

It is an object of the present invention to provide an improved synchronizing signal discrimination circuit. It is a specific object of the present invention to provide a synchronizing signal discrimination circuit which, when a weak television signal is received or the electronic tuner generates a spurious wave so that noises are mixed with the output signals of the video IF amplification and detection circuit, does not malfunction and discriminates the synchronizing signal only when a correct television signal is received and the video IF amplification and detection circuit continuously generates a correct synchronizing signal.

The synchronizing signal is a continuous and periodic signal. On the other hand, the noise is discontinuous and nonperiodic. In the present invention, the above differences between the synchronizing signal and the noise are discriminated. The synchronizing signal discrimination circuit of the present invention detects only the periodic and continuous signal as the synchronizing signal but does not detect the discontinuous and nonperiodic signal as the synchronizing signal. Consequently, only when the electronic tuner receives a correct television signal and the video IF amplification and detection circuit correctly generate the synchronizing signal, the synchronizing signal discrimination circuit produces an output signal. As a result, the channel selection apparatus which uses the synchronizing signal discrimination circuit of the present invention can preset the channels to allow the reception of the correct television signals.

Figure 1:
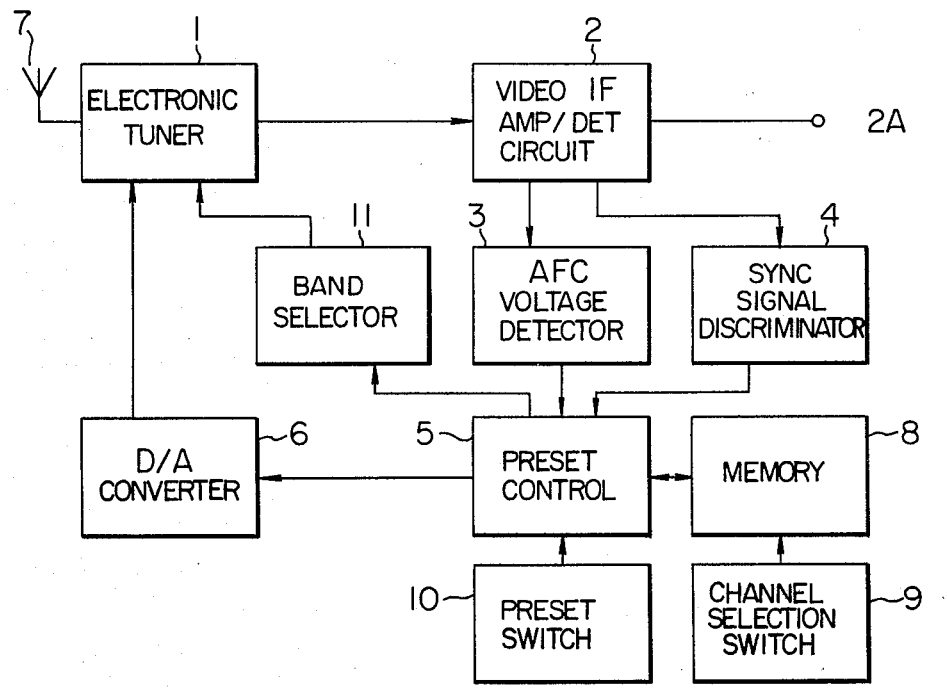
FIG. 1 shows a block diagram of a channel selection apparatus of a television receiver.
Figure 2:
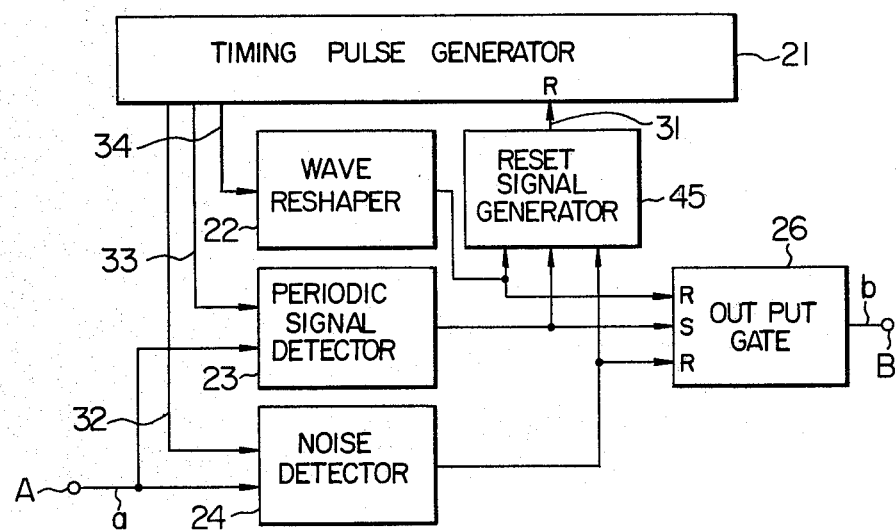
FIG. 2 shows a block diagram of a first embodiment of a synchronizing signal discrimination circuit in accordance with the present invention.

One embodiment of the synchronizing signal discrimination circuit in accordance with the present invention is now explained with reference to the drawings. Referring to FIG. 2, the synchronizing signal discrimination circuit of the present invention comprises a timing pulse generation circuit 21, a wave reshaping circuit 22, a periodic signal detection circuit 23, a noise detection circuit 24, an OR gate 45 and an output gate circuit 26. The operations of the circuit is explained with reference to FIG. 3. First, it is assumed that no signal is upplied to a terminal A. In this case, the circuit generates a signal by itself. That is, at a time $t_o$, the timing pulse generation circuit 21 generates a signal 34a, which is fed to the wave reshaping circuit 22 via a signal line 34. Then, the wave reshaping circuit 22 generates a signal 31a at the time $t_o$. The signal 31a is fed to the reset signal generation circuit 45 which is an OR gate, thence to the timing pulse generation circuit 21. When the signal 31a is generated, the timing pulse generation circuit 21 is reset. A Δt time later from a negative going edge of the signal 31a, that is, at a time $t_1$, after the signal 31a has been fed to the timing pulse generation circuit 21, the timing pulse generation circuit 21 generates a timing pulse signal 32a at a time $t_2$. The signal 32a is fed to the noise detection circuit 24 via a signal line 32. A pulse width $T_1$ of the signal 32a is predetermined as will be explained later. When a time interval corresponding to the pulse width $T_1$ has elapsed from the time $t_2$, that is, at a time $t_3$, the timing pulse generation circuit 21 stops to supply the signal 32a and generates a time interval signal 33a, which is fed to the periodic signal detection circuit 23 via a signal line 33. After the elapse of a time period $T_2$, the signal 33a extinguishes at a time $t_4$ and the timing pulse generation circuit 21 generates a signal 34a. The signals 32a and 33a are again generated and the above operation is repeated. The output gate circuit 26 is reset by the output signal 31a from the wave reshaping circuit 22. The above operation is carried out when no signal is applied to the terminal A and the circuit is waiting for the application of signal at the terminal A. In the absence of signal at the terminal A, the periodic signal detection circuit 23 produces no output signal even when the signal 33a is applied. The noise detection circuit 24 also produces no output signal in the absence of signal at the terminal A even when the signal 32a is applied. The output gate circuit 26 is set to produce the output signal only when the signal from the periodic signal detection circuit 23 is applied. Accordingly, in the present case, it does not produce the output signal. The function described above is not always necessary but it is used to reset the output gate circuit 2b when the input signal is not applied to the terminal A.

The operation when the synchronizing signal is applied to the terminal A is now explained. When a synchronizing signal $S_{y1}$ is applied to the terminal A at a time $t_o{'}$, the synchronizing signal $S_{y1}$ is fed via a signal line a to the periodic signal detection circuit 23 and the noise detection circuit 24. Assuming that the signal 32a is applied to the noise detection circuit 24 at the time $t_o{'}$, the signal 32a and the synchronizing signal $S_{y1}$ are simultaneously applied to the noise detection circuit 24 so that the noise detection circuit 24 generates the output signal, which is fed to the reset signal generation circuit or OR gate 45. The waveform of the output signal is substantially same as that of the synchronizing signal $S_{y1}$. Accordingly, the OR gate 45 produces a signal 31a, which is fed to the timing pulse generation circuit 21, which in turn is reset by the signal 31a at a time $t_1{'}$. The output signal of the noise detection circuit 24 is also applied to the output gate circuit 26 to reset the output gate circuit 26. A $\Delta t$ time later from the reset of the timing pulse generation circuit 21, the timing pulse generation circuit 21 generates a signal 32a at a time $t_2{'}$ and the signal 32a is fed to the noise detection circuit 24. If a signal is not applied from the terminal A to the noise detection circuit 24 while the signal 32a is being supplied to the noise detection circuit 24, that is, during a time period from the time $t_2{'}$ to a time $t_3{'}$, the signal 32a extinguishes at the time $t_3{'}$ and the timing pulse generation circuit 21 generates a signal 33b, which is fed to the periodic signal detection circuit 23. If a synchronizing signal $S_{y2}$ is applied to the terminal A while the signal 33b is being applied to the periodic signal detection circuit 23, e.g. at a time $t_5$, the periodic signal detection circuit 23 generates an output signal, which is fed to the output gate circuit 26 via a signal line b. The output gate circuit 26 is reset by this signal and supplies an output signal $S_o$ to a terminal B. The waveform of the output signal of the periodic signal detection circuit 23 is also substantially identical to that of the synchronizing signal $S_{y2}$. The output signal $S_o$ of the output gate circuit 26 at the terminal B is fed to the preset control circuit 5. The output signal of the periodic signal detection circuit 23 is also fed through the OR gate 45 to the timing pulse generation circuit 21 to reset the same. When the timing pulse generation circuit 21 is reset, the operation described above is repeated, although the output gate circuit 26 continues to supply the output signal $S_o$ to the terminal B until it is reset. Thus, the synchronizing signal discrimination circuit of the present embodiment produces the output signal $S_o$ only when no signal is applied to the terminal B during the time period $T_1$ from the time $t_2{'}$ to the time $t_3{'}$ after the previous signal has been applied to the terminal B and the signal is applied to the terminal B after the time $t_3{'}$, that is, after the elapse of the time period $(T_1+\Delta t)$ from the time $t_1{'}$. Since a period $T_s$ between the synchronizing signals $S_{y1}$ and $S_{y2}$ is predetermined, when the synchronizing signal $S_{y2}$ is applied to the terminal B after the synchronizing signal $S_{y1}$ has been applied, the output signal $S_o$ is exactly generated. The width $T_1$ of the signal 38a is narrower than the period $T_s$ of the synchronizing signals.

The operation when the synchronizing signal and the noise are applied to the terminal A is now explained. When a synchronizing signal $S_{y3}$ is applied to the terminal A at a time $t_{10}$, a signal 31a is generated and the timing pulse generation circuit 21 is reset at a time $t_{11}$. At a time $t_{12}$, the signal 32a is fed to the noise detection circuit 24. If a noise $S_N$ is applied to the terminal A while the signal 32a is being fed to the noise detection circuit 24 e.g. at a time $t_{13}$, the noise $S_N$ is fed to the noise detection circuit 24, which produces an output signal, which in turn is fed to the OR gate 45 and the output gate circuit 26. The waveform of the output signal may be regarded to be substantially identical to the waveform of the noise $S_N$. The timing pulse generation circuit 21 and the output gate circuit 26 are reset by the output signal of the noise detection circuit 24. As a result, the output signal $S_o$ of the output gate circuit 26 extinguishes at a time $t_{14}$. At the same time, the output signal 32a of the timing pulse generation circuit 21 also extinguishes, and at a time $t_{15}$ the signal 32a is again generated. If a synchronizing signal $S_{y4}$ is applied to the terminal A while the signal 32a is being fed to the noise detection circuit 24, e.g. at a time $t_{16}$, the noise detection circuit 24 generates an output signal, which is fed to the reset signal generation circuit or OR gate 45 to again reset the timing pulse generation circuit 21. As a result, the timing pulse generation circuit 21 does not generate the output signal 33b and no signal is fed from the periodic signal detection circuit 23 to the output gate circuit 26 so that the output gate circuit 26 does not produce the output signal $S_o$. In this manner, when the noise $S_N$ is applied to the terminal A, the timing pulse generation circuit 21 is reset so that the output gate circuit 26 does not produce the output signal $S_o$.

As described above, the synchronizing signal discrimination circuit of the present invention produces an output signal when a periodic signal such as synchronizing signal is applied to the terminal A but does not produce the output signal when a noise is applied to the terminal A. Accordingly, it exactly discriminates only the synchronizing signal. Thus, only when the electronic tuner 1 correctly receives the television signal, the output signal of the synchronizing signal discrimination circuit is fed to the preset control circuit so that the channel preset is carried out correctly.

Figure 4:
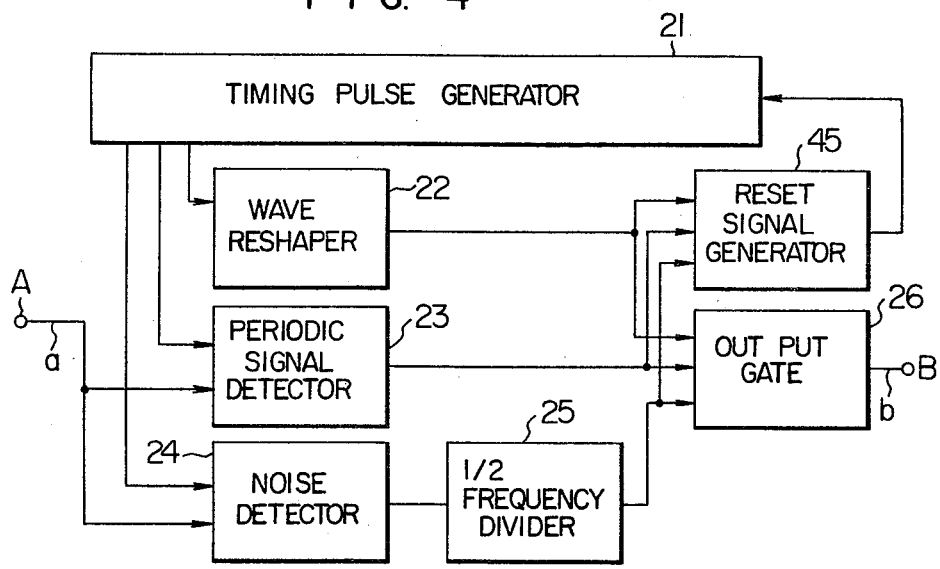
FIG. 4 shows a block diagram of a second embodiment of the synchronizing signal discrimination circuit of the present invention.

An improved synchronizing signal discrimination circuit in accordance with the present invention is now explained. While the synchronizing signal of the television signal is generally periodic, the periodicity may be momentarily lost when a program is changed or a repeater station is switched. In such a case, even if the electronic tuner correctly receives the television signal, the synchronizing signal discrimination circuit of the present invention described above may not temporarily produce the output signal and the channel preset may not be carried out correctly. A second embodiment of the present invention explained hereinbelow resolves the difficulty discussed above. The second embodiment is shown in FIG. 4. In the second embodiment, a $\frac{1}{2}$ frequency divider 25 is connected to the noise detection circuit 24. In the present embodiment, if the noise is applied to the terminal A twice or more while the time interval signal 32a is being fed from the timing pulse generation circuit 21 to the noise detection circuit 24, that is, if the noise detection circuit 24 produces the output signal twice and feeds the two output signals to the $\frac{1}{2}$ frequency divider 25, the $\frac{1}{2}$ frequency divider 25 produces an output signal, which resets the output gate circuit 26. Accordingly, when the period of the synchronizing signals momentarily changes or the noise is applied to the terminal A only once, the output signal $S_o$ of the synchronizing signal discrimination circuit does not extinguish. As a result, even if the period of the synchronizing signal momentarily changes while the electronic tuner is correctly receiving the television signal, the channel preset is carried out correctly.

In the first and second embodiments of the present invention described above, if it happens that the noises are applied to the terminal A at a period substantially equal to the period of the synchronizing signal, the synchronizing signal discrimination circuits of the first and second embodiments produces the output signals. As a result, an erroneous channel preset may be carried out. This problem can be resolved by the following anti-malfunction circuit.

Figure 5:
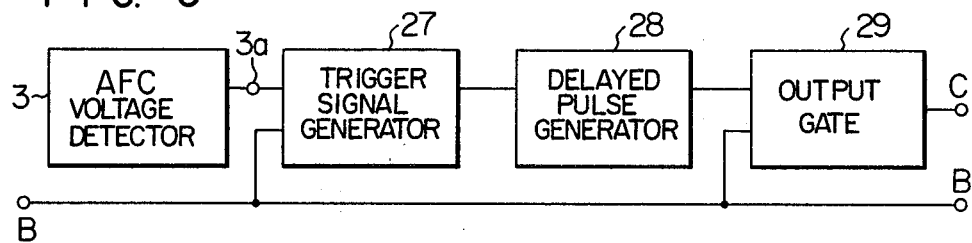
FIG. 5 shows a block diagram of an anti-malfunction circuit to be used in combination with the synchronizing signal discrimination circuit of the present invention.
Figure 6:
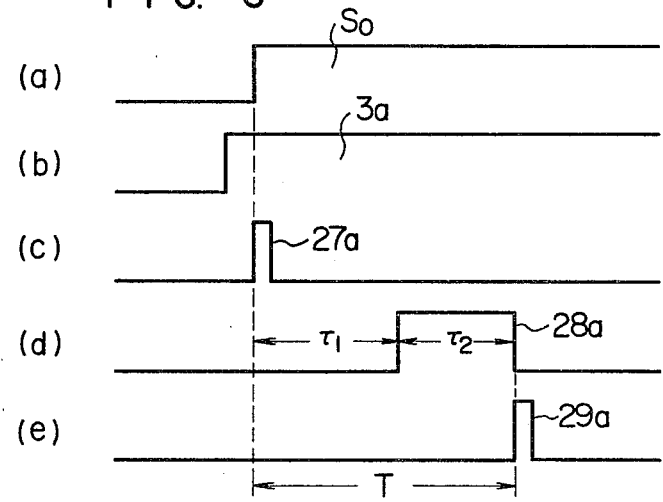
FIG. 6 is a time chart showing waveforms at various points of the anti-malfunction circuit.

Referring to FIG. 5, the anti-malfunction circuit comprises a trigger signal generation circuit 27, a delayed pulse generation circuit 28 connected to the trigger signal generation circuit 27, and an output gate circuit 29. The trigger signal generation circuit 27 is connected to an AFC voltage input terminal 3a which is connected to the AFC voltage detection circuit 3 and to the terminal B. The trigger signal generation circuit 27 produces an output signal only when the signals from the AFC voltage detection circuit 3 and the terminal B are applied, and the output signal is fed to the delayed pulse generation circuit 28. The delayed pulse generation circuit 28 produces an output signal a predetermined time period $\tau_1$ later from the application of the signal from the trigger signal generation circuit 27, and the output signal is fed to the output gate circuit 29. The output signal of the delayed pulse generation circuit 29 continues to appear for a time period $\tau_2$. FIG. 6 shows the signal $S_o$ applied to the terminal B, the output signal 3a of the AFC voltage detection circuit 3, the output signal 27a of the trigger signal generation circuit 27 and the output signal 28a of the delayed pulse generation circuit 28. Applied to the output gate circuit 29 are the output signal 28a of the delayed pulse generation circuit 28 and the signal $S_o$ applied to the terminal B, and the output gate circuit 29 produces the output signal 29a if the signal $S_o$ is continuously applied for the time period $\tau_2$. The output signal 29a is fed to a terminal C. If the signal $S_o$ extinguishes once during the time period $\tau_2$, output gate circuit 29 does not produce the output signal 29a. The output signal 29a is fed from the terminal C to the preset control circuit 5. The present control circuit 5 responds to the signal fed from the terminal B to stop changing the digital value of the digital signal and carries out the channel preset by the signal fed from the terminal C. Thus, the preset control circuit 5 stops changing the digital value of the digital signal in response to the signal fed from the terminal B and does not carry out the channel preset thereafter until the time period T ($=\tau_1+\tau_2$) has elapsed, and after the time period T has elapsed it carries out the channel preset. Assuming that the AFC voltage detection circuit 3 generates the output signal 3a and it happens that signals having a period which is substantially equal to the period of the synchronizing signals are applied to the synchronizing signal discrimination circuit, then the output signal $S_o$ is supplied to the terminal B and the preset control circuit 5 stops changing the digital value of the digital signal. At the sametime, the trigger signal generation circuit 27 supplies the output signal to the delayed pulse generation circuit 28. However, the delayed pulse generation circuit 28 does not immediately supply the output signal 28a to the output gate circuit 29. Accordingly, the channel preset is not carried out immediately. After the time period $\tau_1$ has elapsed, the delayed pulse generation circuit 28 supplies the output signal 28a to the output gate circuit 29. Thereafter, if the synchronizing signal or noise is not applied to the terminal A during the time period $\tau_2$, the synchronizing signal discrimination circuit is reset by the signal 34a generated by the timing pulse generation circuit 21. As a result, the output signal $S_o$ applied to the terminal B extinguishes. As the output signal $S_o$ extinguishes, the signal 29a is not produced so that the preset control circuit 5 again starts to change the digital value of the digital signal. Consequently, the channel preset is not carried out. Accordingly, when the anti-malfunction circuit is used, the erroneous channel preset is not carried out even when the noise having the period which is substantially equal to the period of the synchronizing signal is applied. The time period T is, of course, preselected to be sufficiently longer than the period of the synchronizing signal. By the use of the delayed pulse generation circuit 28, the following additional effect is obtained. Generally, after the electronic tuner has received the television signal, a certain time period is required before the characteristics of the television receiver such as AGC (automatic gain control) characteristic and AFC characteristic stabilize to constant characteristics. By the provision of the delayed pulse generation circuit 28 and the output gate circuit 29, it is possible to wait until the AGC characteristic or the like stabilizes before the channel preset is carried out. Accordingly, the channel preset can be correctly carried out.

The trigger signal generation circuit 27 is not necessarily connected to the AFC voltage detection circuit 3. When the trigger signal generation circuit 27 is not connected to the AFC voltage detection circuit 3 and the AFC voltage is not applied to the trigger signal generation circuit 27, the trigger signal generation circuit 27 produces the signal 27a when the output signal $S_o$ is applied to the trigger signal generation circuit 27.

Figure 7:
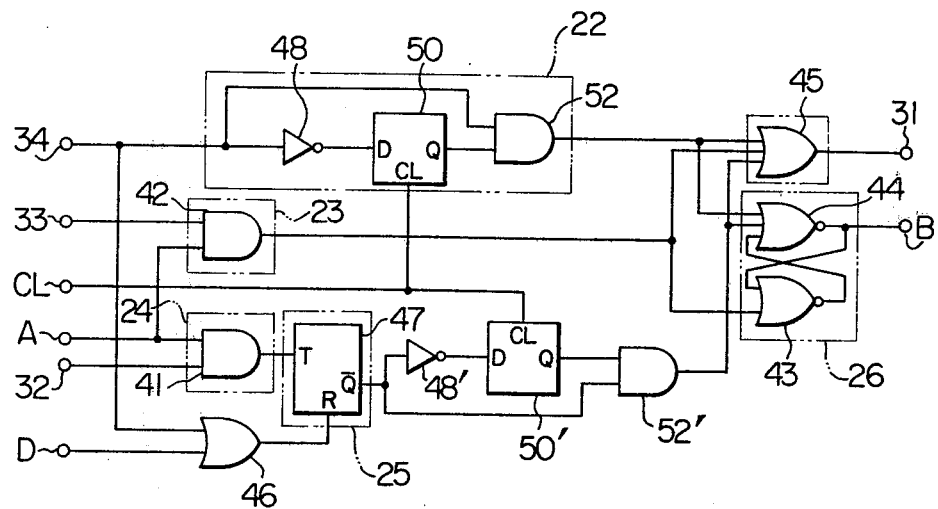
FIG. 7 is a circuit diagram showing a specific circuit configuration of the synchronizing signal discrimination circuit of the present invention.

Referring to FIG. 7, the details of the wave reshaping circuit 22, the noise detector 23, the periodic signal detection circuit 24, the output gate circuit 26 and the reset signal generation circuit 27, which constitute major parts of the synchronizing signal discrimination circuit, are explained. The timing pulse generation circuit 21 comprises a counter and the detail thereof is not explained here. The wave reshaping circuit 22 comprises an inverter 48, a D-type flip-flop 50 and an AND gate 52. The noise detection circuit 23 comprises an AND gate 42, and the periodic signal detection circuit 24 comprises an AND gate 41. The output gate circuit 26 comprises an RS (reset-set) flip-flop comprising NOR gates 43 and 44. The ½ frequency divider 25 comprises a T-type flip-flop 47. Terminals 31–34 correspond to the signal lines 31–34 shown in FIG. 2. Clock signal is applied to a terminal CL.

Figure 8:
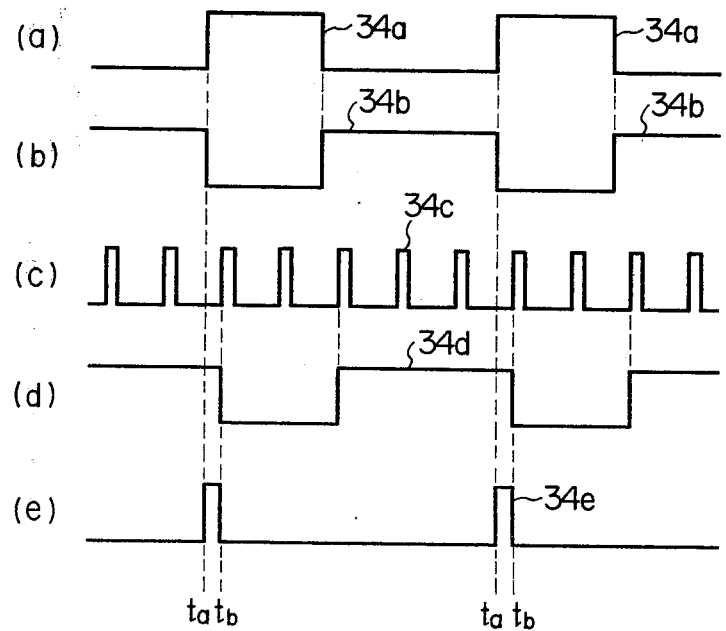
FIG. 8 is a time chart showing waveforms at various points of a reset signal generation circuit.

When a signal is applied to the terminal 34, it is supplied to the wave reshaping circuit 22. The signal is applied to the AND gate 52 and the inverter 48 in the wave reshaping circuit 22. The signal 34a applied to the terminal 34 is shown in FIG. 8 (a). The signal 34a applied to the inverter 48 is inverted therein and the inverted signal is applied to the D-type flip-flop 50. The inverted signal 34b is shown in FIG. 8 (b). The clock signal 34c is applied to the D-type flip-flop 50 so that the signal 34b is delayed by the clock signal 34c and then supplied to the AND gate 52. The clock signal 34c is shown in FIG. 8 (c) and the delayed signal 34d is shown in FIG. 8 (d). As a result, the AND gate 52 produces a reset signal 34e only during a time period in which the signals 34a and 34d are being applied to the AND gate 52, that is, a time period from a time $t_a$ to a time $t_b$, and the reset signal 34e is supplied to the OR gate 45. The reset signal 34e of the AND gate 52 is also supplied to the NOR gate 44 of the output gate circuit 26 to reset the output gate circuit 26.

When signals are applied to the terminal 33 and the terminal A, respectively, the AND gate 42 or the periodic signal detection circuit 23 produces an output signal, which is supplied to the OR gate 45 and the NOR gate 43 of the output gate circuit 26. At this time, the output gate circuit 26 is set and an output signal is produced at the terminal B.

When signals are applied to the terminal A and the terminal 32, respectively, the AND gate 41 or the noise detection circuit 24 produces an output signal, which is supplied to the T-type flip-flop 47 or the ½ frequency divider 25. The ½ frequency divider has been previously reset by a signal supplied from the terminal 34 or the terminal D via the OR gate 46. It produces an output signal whenever it receives two output signals from the noise detection circuit 24, and supplies the output signal to an inverter 48', a D-type flip-flop 50' and an AND gate 52'. The functions of the inverter 48, D-type flip-flop 50' and AND gate 52' are same as those of the wave reshaping circuit 22. An output signal of the AND gate 52' is supplied to the OR gate 45 and the NOR gate 44 of the output gate circuit 26 to reset those. A signal is applied to the ½ frequency divider 25 or the T-type flip-flop 47 from the terminal 34 or the terminal D via the OR gate 46 to previously reset the T-type flip-flop 47.

Figure 3:
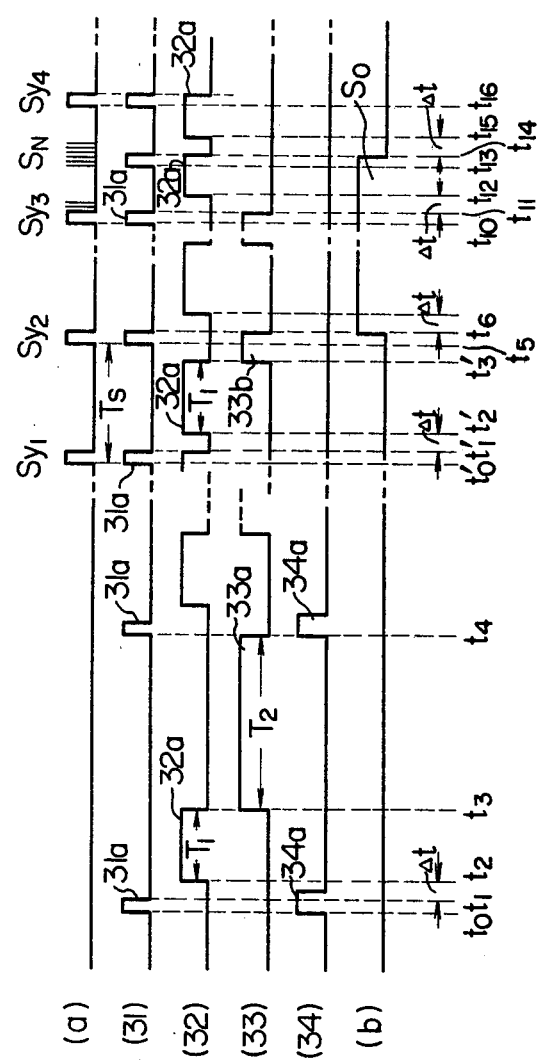
FIG. 3 is a time chart showing waveforms at various points of the synchronizing signal discrimination circuit of the present invention.

It is now assumed that the time period from the time $t_o$ to the time $t_2$ shown in FIG. 3 is selected to 4 milli-seconds, the time period $T_1$ from the time $t_2$ to the time $t_3$, that is, the pulse width $T_1$ of the signal 32 is selected to 4 milli-seconds, and the time period $T_2$ from the time $t_3$ to the time $t_4$, that is, the pulse width $T_2$ of the signal 33a is set to 40 milli-seconds. A vertical synchronizing signal is applied to the terminal A. A period of the vertical synchronizing signal is 16.7 milli-seconds (or 20 milli-seconds in U.K.). If a first vertical synchronizing signal is applied to the terminal A while the signal 33a is being supplied to the terminal 33, that is, during the time period $T_2$, the periodic signal detection circuit 23 or the AND gate 42 produces an output signal, which is fed to the OR gate 45 and the output gate circuit 26. As a result, the OR gate 45 produces an output signal, which is fed to the timing pulse generation circuit 21 via the terminal 31. Thus, the timing pulse generation circuit 21 is reset. The output gate circuit 26 is set to produce the output signal $S_o$, which is fed to the terminal B. When second and third vertical synchronizing signals are sequentially applied to the terminal A following to the first vertical synchronizing signal, the output signal $S_o$ continuously appears at the terminal B because the period of the vertical synchronizing signal is 16.7 milli-seconds (or 20 milli-seconds in U.K.) and the vertical synchronizing signals are applied to the terminal A while the signal 33a is being supplied to the terminal 33. If the vertical synchronizing signal is not applied to the terminal A, the timing pulse generation circuit 21 supplies the output signal 34a to the terminal 34 to reset the output gate circuit 26 so that the output signal $S_o$ extinguishes.

If the first vertical synchronizing signal is applied to the terminal A between the time $t_o$ and time $t_2$, the first vertical synchronizing signal is neglected. In this case, the second vertical synchronizing signal is applied to the terminal A during the time period $T_2$ so that the output signal $S_o$ is produced by the second vertical synchronizing signal.

If the first vertical synchronizing signal is applied to the terminal A during the time period $T_2$, the noise detection circuit 24 or the AND gate 41 produces an output signal, which is fed to the ½ frequency divider 47 or the T-type flip-flop 25. However, since the second vertical synchronizing signal is applied to the terminal A during the time period $T_2$, the output signal $S_o$ is produced by the second vertical synchronizing signal.

If a noise is applied to the terminal A during the time period $T_1$, the noise detection circuit 24 or the AND gate 41 produces an output signal, which is fed to the ½ frequency divider 25 or the T-type flip-flop 47. If the output signal from the AND gate 41 is supplied twice before the T-type flip-flop 47 is reset, the T-type flip-flop 47 produces an output signal, which is shaped by the inverter 48', the D-type flip-flop 50' and the AND gate 52', and the shaped output signal from the AND gate 52' is fed to the OR gate 45 and the output gate circuit 26. The output gate circuit 26 is reset by this output signal. Accordingly, if noises are applied twice to the terminal A during the time period $T_2$, the output gate circuit 26 is reset. The frequency of the clock signal supplied to the D-type flip-flops 50 and 50' is in the order of 16 KHz. While the vertical synchronizing signal is used as the synchronizing signal in the description set forth above, the horizontal synchronizing signal may be used instead. In this case, the time periods $T_1$ and $T_2$ must be appropriately selected.

The operation of the anti-malfunction circuit shown in FIG. 5 is now explained in detail. The time periods $\tau_1$ and $\tau_2$ of the delayed pulse generation circuit 28 are selected to approximately 160 milli-seconds, respectively. Accordingly, during the time period $\tau_2$, nine to ten (or seven to eight in U.K.) vertical synchronizing signals are applied to the terminal A. If several vertical synchronizing signals are lost and the signal $S_o$ at the terminal B extinguishes, the output signal 29a is not produced at the terminal C and the channel preset is not carried out. The output signal 28a of the delayed pulse generation circuit 28 is supplied to the terminal D shown in FIG. 7 so that the $\frac{1}{2}$ frequency divider 25 is reset. Accordingly, even if two or more noises are applied to the terminal A during the time period $\tau_2$ and the signal $S_o$ at the terminal B extinguishes, the output signal 29a is not produced at the terminal C and the channel preset is not carried out.

If the vertical synchronizing signals are sequentially applied to the terminal A during the time period $\tau_2$ and no noise is applied thereto, the antimalfunction circuit produces the output signal 29a. As a result, the channel preset is carried out.

As explained hereinabove, the synchronizing signal discrimination circuit of the present invention does not produce an output signal when noises are superimposed on the synchronizing signal generated by the video IF amplification and detection circuit, such as when the electronic tuner receives a weak television signal or the electronic tuner receives an extremely strong television signal so that the electronic tuner cannot receive the television signal correctly but it produces a spurious wave. Accordingly, in such a case, the channel selection apparatus which uses the synchronizing signal discrimination circuit of the present invention does not malfunction in presetting the channel. When the electronic tuner receives the television signal correctly and the video IF amplification and detection circuit sequentially produces the synchronizing signals, the synchronizing signal discrimination circuit of the present invention detects those synchronizing signals and produces the output signals. As a result, the channel selection apparatus carries out the channel preset. Accordingly, in the channel selection apparatus which uses the synchronizing signal discrimination circuit of the present invention, the channel preset is carried out only when the electronic tuner receives the correct television signal correctly, and by virtue of this channel preset, the channel selection apparatus which uses the synchronizing signal discrimination circuit of the present invention can correctly receive the correct television signal.

What we claim is:

1. A synchronizing signal discrimination circuit for use in a channel selection apparatus having a preset function of a television receiver, comprising;
   (a) a timing pulse generation circuit for generating a first time interval signal having a first predetermined pulse width after a reset signal has been applied thereto and a second time interval signal having a second predetermined pulse width after the expiration of said first time interval signal,
   (b) an input terminal for receiving an input signal,
   (c) a noise detection circuit connected to said timing pulse generation circuit and said input terminal for receiving said first time interval signal from said timing pulse generation circuit and said input signal from said input terminal, said noise detection circuit being operable to produce a noise detection signal only when said first time interval signal and said input signal are simultaneously applied thereto,
   (d) a periodic signal detection circuit connected to said timing pulse generation circuit and said input terminal for receiving said second time interval signal from said timing pulse generation circuit and said input signal from said input terminal, said periodic signal detection circuit being operable to produce a periodic signal detection signal only when said second time interval signal and said input signal are simultaneously applied thereto,
   (e) a reset signal generation circuit connected to said noise detection circuit and said periodic signal detection circuit for producing a reset signal when either said noise detection signal or said periodic signal detection signal is applied thereto, said reset signal being supplied to said timing pulse generation circuit, and
   (f) a first output gate circuit connected to said noise detection circuit and said periodic signal detection circuit, said first output gate circuit being reset when said noise detection signal from said noise detection circuit is applied thereto and set when said periodic signal detection signal from said periodic signal detection circuit is applied thereto to produce a first output signal.

2. A synchronizing signal discrimination circuit according to claim 1 further comprising a $\frac{1}{2}$ frequency divider inserted between said noise detection circuit and said output gate circuit, said $\frac{1}{2}$ frequency divider being operable to produce an output signal when two noise detection signals have been supplied thereto from said noise detection circuit, said output signal of said $\frac{1}{2}$ frequency divider being supplied to said first output gate circuit.

3. A synchronizing signal discrimination circuit according to claim 1 or 2 further comprising;
   (a) a trigger signal generation circuit connected to said first output gate circuit for producing a trigger signal when said first output signal from said first gate circuit is supplied thereto,
   (b) a delayed pulse generation circuit connected to said trigger signal generation circuit for producing a delayed pulse having a third predetermined pulse width a predetermined time later from the application of said trigger signal thereto, and
   (c) a second output gate circuit connected to said delayed pulse generation circuit and said first output gate circuit for receiving said delayed pulse and said first output signal, said second output gate circuit being operable to produce a second output signal only when said first output signal is continuously supplied thereto while said delayed pulse is being supplied.

4. A synchronizing signal discrimination circuit according to claim 1 or 2 further comprising;
   (a) an AFC voltage input terminal for receiving an AFC voltage,
   (b) a trigger signal generation circuit connected to said AFC voltage input terminal and said first output gate circuit for producing a trigger signal only when said AFC voltage and said first output signal are applied thereto,
   (c) a delayed pulse generation circuit connected to said trigger signal generation circuit for producing a delayed pulse having a third predetermined pulse width a predetermined time later from the application of said trigger signal thereto, and
   (d) a second output gate circuit connected to said delayed pulse generation circuit and said first output gate circuit for receiving said delayed pulse and said first output signal, said second output gate circuit being operable to produce a second output signal only when said first output signal is continuously supplied thereto while said delayed pulse is being supplied.

5. A synchronizing signal discrimination circuit for use in a channel selection apparatus having a preset function of a television receiver, comprising;
 (a) a timing pulse generation circuit for generating a first time interval signal having a first predetermined pulse width after a reset signal has been applied thereto, a second time interval signal having a second predetermined pulse width after the expiration of said first time interval signal, and third signal after the expiration of said second time interval signal,
 (b) an input terminal for receiving an input signal,
 (c) a noise detection circuit connected to said timing pulse generation circuit and said input terminal for receiving said first time interval signal from said timing pulse generation circuit and said input signal from said input terminal, said noise detection circuit being operable to produce a noise detection signal only when said first time interval signal and said input signal are simultaneously applied thereto,
 (d) a periodic signal detection circuit connected to said timing pulse generation circuit and said input terminal for receiving said second time interval signal from said timing pulse generation circuit and said input signal from said input terminal, said periodic signal detection circuit being operable to produce a periodic signal detection signal only when said second time interval signal and said input signal are simultaneously applied thereto,
 (e) a reset signal generation circuit connected to said noise detection circuit, said periodic signal detection circuit and said timing pulse generation circuit for producing a reset signal when either one of said noise detection signal from said noise detection circuit, said periodic signal detection signal from said periodic signal detection circuit or said third signal from said timing pulse generation circuit is applied thereto, said reset signal being supplied to said timing pulse generation circuit, and
 (f) a first output gate circuit connected to said noise detection circuit and said periodic signal detection circuit, said first output gate circuit being reset when said noise detection signal from said noise detection circuit is applied thereto and set when said periodic signal detection signal from said periodic signal detection circuit is applied thereto to produce a first output signal.

6. A synchronizing signal discrimination circuit according to claim 5 further comprising a ½ frequency divider inserted between said noise detection circuit and said output gate circuit, said ½ frequency divider being operable to produce an output signal when two noise detection signals have been supplied thereto from said noise detection circuit, said output signal of said ½ frequency divider being supplied to said first output gate circuit.

7. A synchronizing signal discrimination circuit according to claim 5 or 6 further comprising;
 (a) a trigger signal generation circuit connected to said first output gate circuit for producing a trigger signal when said first output signal from said first gate circuit is supplied thereto,
 (b) a delayed pulse generation circuit connected to said trigger signal generation circuit for producing a delayed pulse having a third predetermined pulse width a predetermined time later from the application of said trigger signal thereto, and
 (c) a second output gate circuit connected to said delayed pulse generation circuit and said first output gate circuit for receiving said delayed pulse and said first output signal, said second output gate circuit being operable to produce a second output signal only when said first output signal is continuously supplied thereto while said delayed pulse is being supplied.

8. A synchronizing signal discrimination circuit according to claim 5 or 6 further comprising;
 (a) an AFC voltage input terminal for receiving an AFC voltage,
 (b) a trigger signal generation circuit connected to said AFC voltage input terminal and said first output gate circuit for producing a trigger signal only when said AFC voltage and said first output signal are applied thereto,
 (c) a delayed pulse generation circuit connected to said trigger signal generation circuit for producing a delayed pulse having a third predetermined pulse width a predetermined time later from the application of said trigger signal thereto, and
 (d) a second output gate circuit connected to said delayed pulse generation circuit and said first output gate circuit for receiving said delayed pulse and said first output signal, said second output gate circuit being operable to produce a second output signal only when said first output signal is continuously supplied thereto while said delayed pulse is being supplied.

* * * * *